US005866305A

United States Patent [19]

Chon et al.

[11] Patent Number: 5,866,305

[45] Date of Patent: Feb. 2, 1999

[54] THINNER COMPOSITION FOR WASHING A PHOTORESIST IN A PROCESS FOR PREPARING SEMICONDUCTORS

[75] Inventors: Sang-moon Chon, Songnam; Boo-sup Lee, Seoul; Sung-il Kim, Suwon; Jun-ing Gil, Songnam; Pil-kwon Jun; Me-suk Jun, both of Seoul, all of Rep. of Korea

[73] Assignee: Samsung Electronics Co., Ltd., Suwon, Rep. of Korea

[21] Appl. No.: 771,774

[22] Filed: Dec. 20, 1996

[30] Foreign Application Priority Data

Sep. 21, 1996 [KR] Rep. of Korea ...................... 96-41507

[51] Int. Cl.$^{6}$ ...................................................... G03C 5/00

[52] U.S. Cl. ........................................... 430/331; 430/311

[58] Field of Search ..................................... 430/331, 311

[56] References Cited

U.S. PATENT DOCUMENTS

| | | | |
|---|---|---|---|
| 4,965,167 | 10/1990 | Salamy | 430/191 |
| 5,362,608 | 11/1994 | Flaim et al. | 430/327 |
| 5,426,017 | 6/1995 | Johnson | 430/331 |

FOREIGN PATENT DOCUMENTS

| | | |
|---|---|---|
| 6212193 | 8/1994 | Japan . |
| 90-5345 | 7/1990 | Rep. of Korea . |

OTHER PUBLICATIONS

DeForest, W.S., Photoresist Materials and Processes, McGraw–Hill, NY, 1975, pp. 222–224.

*Primary Examiner*—Janet Baxter
*Assistant Examiner*—Rosemary Ashton
*Attorney, Agent, or Firm*—Jones & Volentine, L.L.P.

[57] ABSTRACT

A thinner composition used in a washing process for manufacturing semiconductor devices includes at least ethyl lactate (EL) and ethyl-3-ethoxy propionate (EEP), and preferably, additionally includes Gamma-butyrolactone. The thinner composition has high volatility and low viscosity as well as a sufficient solubility rate for rinsing photoresist on the wafer when spraying the thinner through nozzles. Photoresist at the edge or backside of a wafer can be effectively removed at a sufficiently rapid rate, so that the yield of the semiconductor devices is enhanced. In addition, any remaining photoresist attached to the surface can be completely removed to enable the reuse of the wafer, with resulting economic benefits.

9 Claims, 2 Drawing Sheets

1
2
3

THINNER COMPOSITION FOR WASHING A PHOTORESIST IN A PROCESS FOR PREPARING SEMICONDUCTORS

BACKGROUND OF THE INVENTION

1. Field of the Invention

The present invents relates to a thinner composition for washing a photoresist in a process for manufacturing semiconductors. More specifically, the present invention relates to a thinner solvent composition for washing a photoresist in a process for manufacturing semiconductors, which can be used to remove the unnecessary or excess photoresist on the edge portion and the backside of the wafer, for the photoresist layer used as a mask.

2. Description of the Related Art

Among the stages in the process for manufacturing semiconductor devices, photolithography is one of the most important. The photolithography stage generally comprises coating a photoresist on a wafer, optically transferring the previously designed pattern, and properly etching the wafer according to the transferred pattern.

More specifically, the photolithography stage can be largely divided into the following steps:

1) a coating step where the photoresist is uniformly coated on the surface of the wafer;

2) a soft baking step where the solvent is evaporated from the coated photoresist to intimately attach the photoresist to the surface of the wafer;

3) a light-exposure step where the wafer is exposed to light, which is reductively projecting the circuit pattern on the mask repeatedly and sequentially by the use of a light source such as ultra-violet, to thereby transfer the circuit pattern onto the wafer;

4) a developing step where selected portions of the photoresist, having different physical properties such as solubility caused by light sensitivity from the light-exposure step, are removed;

5) a hard baking step for further adhering the photoresist, which remained on the wafer after the developing step, to the wafer;

6) an etching step where predetermined portions of the wafers are etched in order to impart electric properties depending on the pattern developed on the wafer;

7) a peeling step where the unneeded photoresist is removed.

In addition, the photolithography process requires another step where the excess photoresist coated on the edge or backside of the wafer is removed, after the soft baking step (2). Otherwise, if the photoresist remains on the edge or backside of the wafer, a variety of defects may occur in subsequent semiconductor processing steps, such as etching or ion injection, so that the overall yield of the semiconductor devices may be lowered.

According to the conventional art, in order to remove the photoresist existing on the edge or backside of the wafer, spraying nozzles are provided on the top and bottom of the wafer edge portion so that a thinner organic solvent composition is sprayed on the edge or backside of the wafer through the nozzles.

The present invention relates to an improved thinner solvent composition. The elements which determine the performance of the thinner include solubility rate, volatility and viscosity.

The solubility rate of a thinner determines how effectively the thinner can dissolve and remove the photoresist. It is obvious that the desired solubility rate depends on the object of using the thinner.

As to volatility, the thinner should be easily evaporated after removing the photoresist so that the thinner does not remain on the surface of the wafer. If a low volatility thinner remains on the surface of the wafer, the thinner itself would act as a polluting source in various processes, particularly the etching process, thereby lowering the yield of the semiconductor device. However, if the volatility is too high, the thinner would evaporate during handling causing contamination problems in the clean room.

The proper viscosity is also an essential property to facilitate the spraying of thinner through the nozzles. If the viscosity is too high, an excessively high spraying pressure would be required to spray the thinner through the nozzles. If viscosity is too low, the spray focus would deteriorate because the thinner could not be concentrated or focused on the contact position of the wafer after exiting the spray nozzles.

Particularly, in the case of edge rinsing, the thinner must have the proper solubility rate in order to ensure a smooth wafer cross section after treatment. As shown in FIGS. 1 and 2, if the solubility rate is too low, a so-called tailing condition occurs. This flow of partially solubilized photoresist or tail 3, occurs while rinsing the photoresist 2 that had been coated on the wafer 1.

On the other hand, as shown in FIGS. 3 through 5, if the solubility rate is too high, an erosion portion 4 of the photoresist 2, a so-called photoresist attack, may occur while rinsing the photoresist 2 which had been coated on the wafer 1. Both tailing and photoresist attack directly cause wafer inferiorities, thereby lowering the yield of the semiconductor devices.

If the volatility is too low, the thinner may remain at the edge portion of the wafers, particularly at the flat zone used in the alignment of the wafers after spin drying. Then, the remaining thinner would build-up again on the photoresist of the wafers after the developing step to make a lump of the photoresist at the flat zone portion, directly causing a lowering of the yield of semiconductor devices from the wafers. On the other hand, if the volatility is too high, the thinner would evaporate before completely removing the photoresist so that the cleaning efficiency of the photoresist would be lowered.

Conventional thinners, such as ethyleneglycol monoethylether acetate (ECA), n-butyl acetate (n-BA), propyleneglycol monomethylether acetate (PGMEA) and ethyl lactate (EL), or the like, have been used.

In the case of ethyleneglycol monoethylether acetate and n-butyl acetate, although the solubility rate is good, the volatility and inflammability are too high and they are toxic to humans when inhaled or contacted on the skin. In particular, the toxicity of ethyleneglycol monoethylether acetate may cause leukopenia and miscarriage of an embryo.

The solubility rate is too low to give a sufficient rinse effect in the case of propyleneglycol monomethylether acetate or ethyl lactate.

A rinse treating method using a rinse solvent comprising an ether compound represented by the general formula of $R^1—O—(—CHR^2—CH_2—O—)_n—H$ has been disclosed in Korean Patent Publication No. 90-5345, which is incorporated herein by reference. According to the Publication, the rinse solvent has no toxicity. The rinse solvent may be used to remove and peel off the photoresist layer by completely depositing the wafer on which the photoresist had been coated in the solvent. However, the rinse solvent may not be used to remove (i.e., partially remove the photoresist from the edge and backside portions of the wafer) the photoresist by spraying the solvent through the nozzles.

Accordingly, there exists a need for a thinner having the proper solubility rate for certain photoresists, with proper volatility and viscosity, but without being toxic to humans.

SUMMARY OF THE INVENTION

The object of the present invention is to provide a thinner solvent composition for washing a photoresist in a process for manufacturing semiconductors, which can be used to remove the unnecessary or excess photoresist on the edge portion and the backside of the wafer, wherein the photoresist layer is used as a mask.

Another object of the present invention is to provide a thinner solvent composition for washing a photoresist in a process for manufacturing semiconductors, which has a sufficient solubility rate for the photoresist, but has low toxicity to the human body.

Another object of the present invention is to provide a thinner solvent composition for washing a photoresist in a process for manufacturing semiconductors, which can remove the photoresist as it is sprayed through nozzles, to ensure a smooth wafer cross section after treatment.

To achieve one or more of the above objects, a thinner solvent composition for washing a photoresist in a process for manufacturing semiconductors according to the present invention comprises a mixture of ethyl lactate and ethyl-3-ethoxy propionate (EEP). Preferably, the thinner is a mixture of Gamma-butyrolactone (GBL) as well as ethyl lactate and ethyl-3-ethoxy propionate. More preferably, the thinner is a mixture of 60–80% by weight of ethyl lactate and 40–20% by weight of ethyl-3-ethoxy propionate.

The viscosity of the thinner composition for washing a photoresist in a process for manufacturing semiconductors may be 1.0–2.0 cps, preferably 1.3–1.9 cps.

More preferably, extremely pure ethyl lactate and ethyl-3-ethoxypropionate of semiconductor degree quality are used. If the compounds of Very Large Scale Integration (VLSI) degree are used, compounds which have been filtered in 0.2 $\mu$m level could be used.

The safety aspects of ethyl lactate have been recognized by the Food and Drug Administration (FDA) of United States, and it is now used as a food additive. It has been also recognized as being safe to the human body. The 50% lethal dose ($LD_{50}$) was 2.5 g/kg taken by oral administration in toxicity tests with mice. Ethyl lactate is rapidly decomposed into a lactic acid and ethanol by the action of enzymes. The physical properties of ethyl lactate are as follows: density; 0.97 g/cm$^3$/boiling point; 156° C./ignition point [measured by closed cup method]; 52° C./viscosity at 25° C.; 2.38 cps.

Ethyl-3-ethoxy propionate exists as a liquid at room temperature, and is used as an intermediate for vitamins or other chemicals. Its specific toxicity to humans has not yet been reported. The physical properties of ethyl-3-ethoxy propionate are as follows: density; 0.95 g/cm$^3$/boiling point; 170.1° C./ignition point [measured by open cup method]; 82.2° C./viscosity at 25° C.; 1.20 cps.

In order to increase the solubility rate of the thinner mixture without substantially altering the volatility or viscosity, Gamma-butyrolactone may be additionally contained in the mixture of ethyl lactate and ethyl-3-ethoxy propionate.

Gamma-butyrolactone has been used as a solvent for synthetic resins. Gamma-butyrolactone has a high ignition point and is relatively stable as a solvent. The 50% lethal dose ($LD_{50}$) was 1.5 g/kg taken by oral administration in toxicity tests with mice. It has been proven to be safe, to the extent that it did not cause toxic symptoms in skin contact and intake tests for 3 months. The physical properties of Gamma-butyrolactone are as follows: density; 1.128 g/cm$^3$/boiling point; 204° C./ignition point [measured by closed cup method]; 100° C./viscosity at 25° C.; 1.77 cps.

When the Gamma-butyrolactone is added to the mixture of ethyl lactate and ethyl-3-ethoxy propionate, 10–70% by weight of ethyl lactate, 80–30% by weight of ethyl-3-ethoxy propionate and not more than 10% by weight of Gamma-butyrolactone may be admixed.

Preferably, the thinner composition comprises 20–60% by weight of ethyl lactate, 72–39% by weight of ethyl-3-ethoxy propionate and 1–8% by weight of Gamma-butyrolactone.

More preferably, the thinner composition comprises 20–40% by weight of ethyl lactate, 74–58% by weight of ethyl-3-ethoxy propionate and 2–6% by weight of Gamma-butyrolactone.

BRIEF DESCRIPTIONS OF DRAWINGS

The above objects and other advantages of the present invention will become more apparent by describing in detail a preferred embodiment of the present invention with reference to the attached drawings in which.

DETAILED DESCRIPTION OF PREFERRED EMBODIMENT

Figure 1:
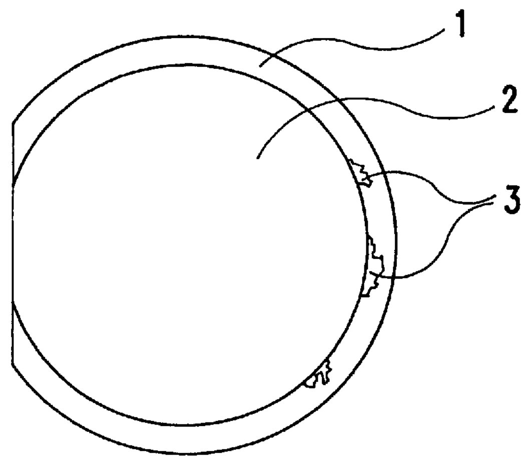
FIG. 1 is a plan view illustrating the outline of the tailing phenomenon which may occur while washing the photoresist coated on the wafer.
Figure 2:
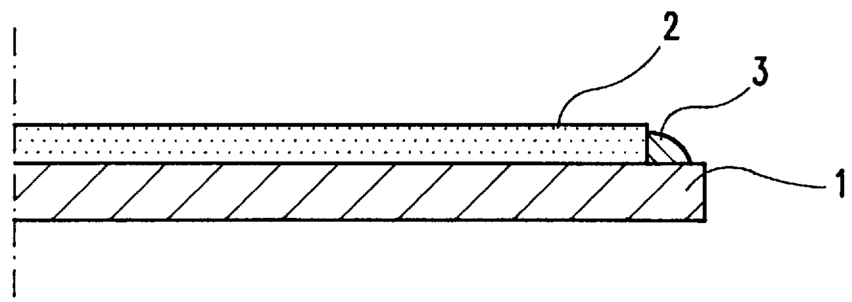
FIG. 2 is a side sectional view of the wafer shown in FIG. 1.
Figure 3:
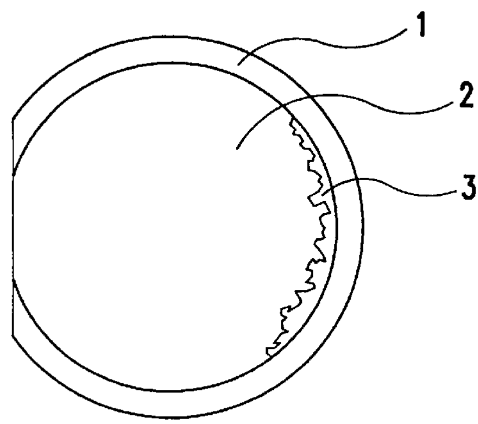
FIG. 3 is a plan view illustrating the outline of the photoresist attack phenomenon which may occur while washing the photoresist coated on the wafer.
Figure 4:
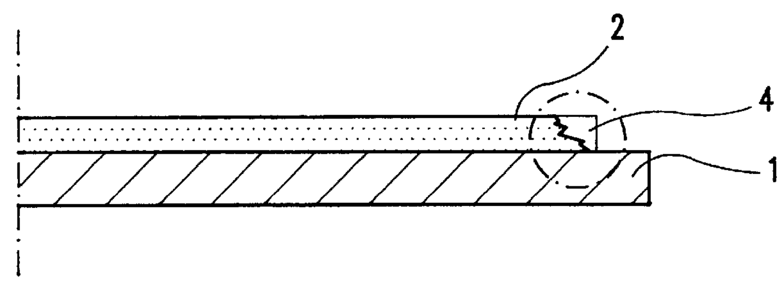
FIG. 4 is a side sectional view of the wafer shown in FIG. 3.
Figure 5:
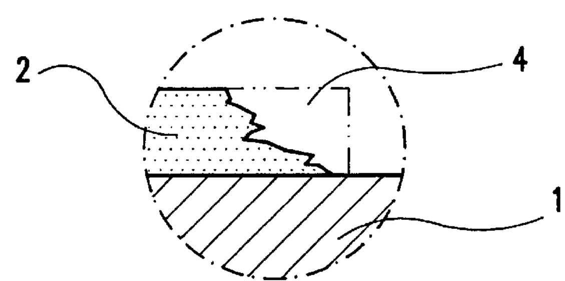
FIG. 5 is a detail view of the wafer edge shown in the dashed circle in FIG. 4.

The specific embodiments described below are compared to the Comparative Examples (Comp. Ex.) with reference to the solubility rate, volatility and viscosity. The embodiments are described only for illustrating the present invention, and it is understood that the scope of the present invention is not strictly limited to these embodiments.

Solubility Rate of Thinners for the Photoresist

According to the present invention, the solubility rate of each thinner composition and other commercially available thinners for DSAM-200 and DPR-2053 among the various commercially available photoresists were measured. Each photoresist was coated on a silicon wafer for manufacturing a semiconductor at a thickness of 12,000 Å to 32,000 Å, and then was soft baked at a temperature of 100°–110° C. for at least 90 seconds. DRM was used as a measuring tool. The experimental results depending on the experimental conditions are shown in Tables 1 and 2, respectively.

TABLE 1

Solubility Rate of Each Thinner for the Photoresist (DSAM-200) [Coated thickness; 15,000Å, soft bake condition; 100° C., 90 sec]

| | | | Solubility rate (Å/s) |
|---|---|---|---|
| Type of the Thinner | Embodiment 1 | EL:EEP = 70:30 | 1,126 |
| | Embodiment 2 | EL:EEP = 60:40 | 1,270 |
| | Embodiment 3 | EL:EEP = 50:50 | 1,350 |
| | Embodiment 4 | EL:GBL:EEP = 60:2:38 | 1,224 |
| | Embodiment 5 | EL:GBL:EEP = 60:5:35 | 1,336 |
| | Embodiment 6 | EL:GBL:EEP = 50:5:45 | 1,394 |
| | Embodiment 7 | EL:GBL:EEP = 40:5:55 | 1,650 |
| | Embodiment 8 | EL:GBL:EEP = 30:5:65 | 1,685 |
| | Embodiment 9 | EL:GBL:EEP = 20:5:75 | 1,690 |
| | Comp. Ex.1 | EL | 942 |
| | Comp. Ex.2 | GBL | ≧4,000 |
| | Comp. Ex.3 | EEP | 1,780 |
| | Comp. Ex.4 | ECA | 1,989 |
| | Comp. Ex.5 | EL:GBL = 80:20 | 2,350 |

As shown in Table 1, the solubility rate of the photoresist increases as the content of ethyl-3-ethoxy propionate increases in the case of a mixture of ethyl lactate and ethyl-3-ethoxy propionate. The solubility rate of the photoresist increases as the content of Gamma-butyrolactone and ethyl-3-ethoxy propionate increases in the case of the composition comprising ethyl lactate, Gamma-butyrolactone and ethyl-3-ethoxy propionate. Thus, the solubility rate is adjustable, and a predetermined solubility rate can be easily attained.

TABLE 2

Solubility Rate of each Thinner for the Photoresist (DPR-2053) [Coated thickness; 32,000Å, soft bake condition; 110° C., 90 sec]

| | | | Solubility rate (Å/s) |
|---|---|---|---|
| Type of the Thinner | Embodiment 1 | EL:EEP = 70:30 | 1,100 |
| | Embodiment 2 | EL:EEP = 60:40 | 1,250 |
| | Embodiment 3 | EL:EEP = 50:50 | 1,300 |
| | Embodiment 10 | EL:GBL:EEP = 60:10:30 | 1,779 |
| | Embodiment 5 | EL:GBL:EEP = 60:5:35 | 1,934 |
| | Embodiment 6 | EL:GBL:EEP = 50:5:45 | 2,006 |
| | Embodiment 7 | EL:GBL:EEP = 40:5:55 | 2,042 |
| | Embodiment 8 | EL:GBL:EEP = 30:5:65 | 2,079 |
| | Embodiment 9 | EL:GBL:EEP = 20:5:75 | 2,060 |
| | Embodiment 11 | EL:GBL:EEP = 10:5:85 | 1,978 |
| | Comp. Ex.1 | EL | 909 |
| | Comp. Ex.2 | GBL | ≧3,500 |
| | Comp. Ex.3 | EEP | 1,613 |
| | Comp. Ex.4 | ECA | 1,900 |
| | Comp. Ex.5 | EL:GBL = 80:20 | 2,004 |

As shown in Table 2, the solubility rate of the photoresist increases as the content of Gamma-butyrolactone and ethyl-3-ethoxy propionate increases in the case of the composition comprising ethyl lactate, Gamma-butyrolactone and ethyl-3-ethoxy propionate. However, if the content of ethyl lactate is less than 20% by weight, the solubility rate is rather reduced. Therefore, the solubility rate is adjustable and a predetermined solubility rate can be easily attained.

Volatility of Thinners

One milliliter of thinner was dropped on a wafer by using a coater widely used in the process for manufacturing semiconductors. Then the wafer was revolved while changing the rate in the range from 1,000 to 5,000 rpm, to measure the time when the thinner would be completely evaporated to the edge portion of the wafer. The results are shown in Table 3.

TABLE 3

Volatility of Thinner on Wafer (unit:sec)

| | | Revolution rate (rpm) | | | | |
|---|---|---|---|---|---|---|
| | | 5,000 | 4,000 | 3,000 | 2,000 | 1,000 |
| Type of the Thinner | | | | | | |
| Emb. 1 | EL:EEP = 70:30 | 7 | 9 | 17 | 40 | 140 |
| Emb. 2 | EL:EEP = 60:40 | 7 | 9 | 16 | 35 | 135 |
| Emb. 3 | EL:EEP = 50:50 | 6 | 8 | 14 | 32 | 120 |
| Emb. 5 | EL:GBL:EEP = 60:5:35 | 7 | 11 | 15 | 33 | 124 |
| Emb. 6 | EL:GBL:EEP = 50:5:45 | 7 | 11 | 17 | 36 | 133 |
| Emb. 7 | EL:GBL:EEP = 40:5:55 | 7 | 12 | 20 | 38 | 141 |
| Emb. 8 | EL:GBL:EEP = 30:5:65 | 7 | 11 | 20 | 38 | 144 |
| Emb. 9 | EL:GBL:EEP = 20:5:75 | 7 | 11 | 20 | 39 | 145 |
| Comp.Ex.1 | EL | 6 | 8 | 14 | 31 | 120 |
| Camp.Ex.2 | GBL | 58 | 71 | 131 | — | — |
| Comp.Ex.3 | EEP | 6 | 9 | 17 | 35 | 138 |
| Comp.Ex.4 | ECA | 4 | 6 | 13 | 24 | 88 |
| Comp.Ex.5 | EL:GBL = 80:20 | 29 | 43 | 87 | 124 | 420 |

According to the present invention, as shown in Table 3, the thinner composition including ethyl lactate and ethyl-3-ethoxy propionate rapidly evaporates at an evaporation rate similar to that of the individual ethyl lactate or ethyl-3-ethoxy propionate, respectively, and thoroughly evaporates even at the edge portion. When Gamma-butyrolactone has a very low volatility, but an excellent solubility rate for the photoresist in the mixed thinner, the composition rapidly evaporates at an evaporation rate similar to that of the individual ethyl lactate or ethyl-3-ethoxy propionate, respectively, and thoroughly evaporates at the edge portion. In addition, the volatility of the thinner constantly increases as the content of ethyl lactate increases so that the volatility rate is adjustable, and a predetermined volatility rate can be easily attained.

Viscosity of Thinners

The viscosity of each thinner used in the embodiments and comparative embodiments was measured. The results are shown in Table 4. viscosity is an essential element to properly adjust the spraying pressure in the spraying system and to adjust the nozzles for spraying the thinner. High viscosity may cause needless loss of pressure.

TABLE 4

Viscosity of Each Thinner (unit: cps, at 25° C.)

| | | | Viscosity (cps) |
|---|---|---|---|
| Type of the Thinner | Emb. 1 | EL:EEP = 70:30 | 1.82 |
| | Emb. 2 | EL:EEP = 60:40 | 1.75 |
| | Emb. 3 | EL:EEP = 50:50 | 1.70 |
| | Emb. 5 | EL:GBL:EEP = 60:5:35 | 1.74 |
| | Emb. 6 | EL:GBL:EEP = 50:5:45 | 1.65 |
| | Emb. 7 | EL:GBL:EEP = 40:5:55 | 1.50 |
| | Emb. 8 | EL:GBL:EEP = 30:5:65 | 1.48 |
| | Emb. 9 | EL:GBL:EEP = 20:5:75 | 1.40 |
| | Comp. Ex.1 | EL | 2.38 |
| | Comp. Ex.2 | GBL | 1.77 |
| | Comp. Ex.3 | EEP | 1.20 |

TABLE 4-continued

Viscosity of Each Thinner (unit: cps, at 25° C.)

| | | Viscosity (cps) |
|---|---|---|
| Comp. Ex.4 | ECA | 1.32 |
| Comp. Ex.5 | EL:GBL = 80:20 | 2.25 |

As shown in Table 4, in the case of the thinner compositions of the present invention, low viscosity comparable to ethyl lactate is maintained even after mixing ethyl lactate with ethyl-3-ethoxy propionate. Thus an excessive loss of pressure does not occur when the thinner is sprayed through the nozzles. In addition, when Gamma-butyrolactone, having a relatively high viscosity but an excellent solubility rate for the photoresist, is admixed, lower viscosity can be maintained so that excessive loss of pressure may not occur at the time of spraying the thinner through the nozzles. Further, the viscosity constantly decreases as the content of ethyl-3-ethoxy propionate increases, whereby a predetermined viscosity can be easily attained and adjusted.

The thinner composition for washing photoresist in manufacturing semiconductors may be used for removing photoresist attached to the surface of those wafers that exhibited inferiorities during the photolithography stage. As such, in this step, the general rinsing process is different, whereby the wafer coated with the photoresist is impregnated in a vessel that contains the thinner composition to remove the photoresist, so that the wafer can be reused. As the dimensions of the wafers used in semiconductor manufacturing increase in size, the ability to reuse each piece of the wafer is economically valuable.

Thus, according to the present invention, a thinner composition having high volatility, low viscosity and a sufficient solubility rate for rinsing photoresist on the wafer by spraying the thinner through nozzles can be obtained. Thus, the yield of semiconductor devices can be enhanced, and the photoresist on the edge and the backside can be removed economically and rapidly.

In addition, according to the present invention, reuse and economic use of wafers can be performed by removing photoresist attached to the surface of those wafers that exhibited inferiorities during the photolithography stage, or those optionally selected for administering this process.

While the present invention has been particularly described with reference to the specific embodiments, it will be understood by those skilled in the art that various changes and modifications may be effected therein without departing from the spirit and scope of the invention as set forth in the appended claims.

What is claimed is:

1. A thinner composition for washing off excess photoresist on a wafer in manufacturing semiconductors, comprising a mixture of ethyl lactate (EL), Gamma-butyrolactone(GBL) and ethyl-3-ethoxy propionate (EEP).

2. The thinner composition for washing photoresist in manufacturing semiconductors according to claim 1, having a viscosity in a range from 1.0 to 2.0 cps.

3. The thinner composition for washing photoresist in manufacturing semiconductors according to claim 1, having a viscosity in a range from 1.30 to 1.90 cps.

4. The thinner composition for washing photoresist in manufacturing semiconductors according to claim 1, said mixture comprising 10–70% by weight of ethyl lactate, up to 10% by weight of Gamma-butyrolactone, and 80–30% by weight of ethyl-3-ethoxy propionate.

5. The thinner composition for washing photoresist in manufacturing semiconductors according to claim 1, said mixture comprising 20–60% by weight of ethyl lactate, 1–8% by weight of Gamma-butyrolactone, and 72–39% by weight of ethyl-3-ethoxy propionate.

6. The thinner composition for washing photoresist in manufacturing semiconductors according to claim 1, said mixture comprising 20–40% by weight of ethyl lactate, 2–6% by weight of Gamma-butyrolactone, and 74–58% by weight of ethyl-3-ethoxy propionate.

7. The thinner composition for washing photoresist in manufacturing semiconductors according to claim 1, wherein the ethyl lactate, Gamma-butyrolactone and ethyl-3-ethoxy propionate used are of a purity suitable for semiconductor processing.

8. The thinner composition for washing photoresist in manufacturing semiconductors according to claim 1, wherein the ethyl lactate, Gamma-butyrolactone and ethyl-3-ethoxy propionate used are reagents which have been passed through a 0.2 $\mu$m sieve.

9. The thinner composition for washing photoresist in manufacturing semiconductors according to claim 1, having a viscosity of approximately 1 cps.

* * * * *